United States Patent [19]

Feldman

[11] Patent Number: 4,724,222

[45] Date of Patent: Feb. 9, 1988

[54] WAFER CHUCK COMPRISING A CURVED REFERENCE SURFACE

[75] Inventor: Martin Feldman, Berkeley Heights, N.J.

[73] Assignee: American Telephone and Telegraph Company, AT&T Bell Laboratories, Murray Hill, N.J.

[21] Appl. No.: 856,175

[22] Filed: Apr. 28, 1986

[51] Int. Cl.⁴ .................... B24B 47/00; B25B 11/00; B23B 5/34; H01L 21/68

[52] U.S. Cl. .................... 437/173; 29/559; 29/569.1; 269/21; 279/3; 250/492.2; 51/235

[58] Field of Search ............... 29/569 R, 559; 269/21; 51/235; 279/3; 250/492.21, 492.22, 440.1; 148/1.5

[56] References Cited

U.S. PATENT DOCUMENTS

| | | | |
|---|---|---|---|
| 3,920,233 | 11/1975 | Stuckert | 269/55 |
| 4,213,698 | 7/1980 | Firtion et al. | 355/77 |
| 4,310,743 | 1/1982 | Seliger | 250/492.21 |
| 4,443,704 | 4/1984 | Yamashita et al. | 250/492.2 |
| 4,475,223 | 10/1984 | Taniguchi et al. | 250/492.2 |
| 4,517,465 | 5/1985 | Gault et al. | 250/492.21 |
| 4,603,466 | 8/1986 | Marley | 29/569 R |

FOREIGN PATENT DOCUMENTS 57-92831  9/1982  Japan .

Primary Examiner—Olik Chaudhuri
Attorney, Agent, or Firm—Lucian C. Canepa

[57] ABSTRACT

A chuck for holding a workpiece (e.g., a semiconductor wafer) in a vacuum comprises a curved reference surface. By clamping the edges of the workpiece and maintaining its backside against the curved surface (or against pins mounted on the surface), the frontside of the workpiece can be thereby established in a precise equidistant relationship with respect to the reference surface. Such a chuck is advantageous for holding wafers to be lithographically patterned in a high-resolution way by electron-beam, ion-beam and X-ray-beam techniques.

8 Claims, 3 Drawing Figures

WAFER CHUCK COMPRISING A CURVED REFERENCE SURFACE

BACKGROUND OF THE INVENTION

This invention relates to techniques for holding workpieces in a vacuum environment and, more particularly, to a method for holding a semiconductor wafer in a vacuum during lithographic pattern exposure in an integrated-circuit fabrication sequence.

Vacuum chucks are well known in the semiconductor art. They constitute versatile and reliable instrumentalities for holding semiconductor wafers during pattern delineation in photolithographic processes. By means of such chucks, wafers that inevitably exhibit some warpage can be firmly held during exposure in a manner to ensure that the wafer surface to be irradiated is maintained essentially flat. Such flatness is generally regarded as a prerequisite for achieving a high-resolution pattern.

In lithographic systems utilizing electron beams or ion beams, and even in some systems employing X-rays, the wafers to be irradiated during pattern delineation are contained in a vacuum environment. Of course, in such systems vacuum chucks unfortunately cannot be used to hold the wafers.

Mechanical clamping of the edges of a wafer is generally not sufficient by itself to ensure the surface flatness required for high-resolution patterning in a vacuum environment. And although electrostatic and magnetic chucks have been suggested for use in a vacuum, such chucks have generally not been viewed as attractive instrumentalities for use in manufacturing integrated-circuit devices.

Thus, efforts have been directed by workers skilled in the art aimed at trying to devise an improved workpiece holder for use in a vacuum environment. It was recognized that such efforts, if successful, would be of particular value in holding semiconductor wafers during the process of making integrated-circuit devices.

SUMMARY OF THE INVENTION

Accordingly, an object of the present invention is a workpiece holder for use in a vacuum environment. More specifically, an object of this invention is a method for holding a semiconductor wafer in a vacuum during pattern exposure in an integrated-circuit fabrication sequence.

Briefly, these and other objects of the present invention are realized in a specific illustrative embodiment thereof in which a chuck for holding a semiconductor wafer in a vacuum comprises a curved reference surface such as a portion of the surface of the cylinder. By clamping the edges of the wafer and thereby bending it to firmly establish its backside against the curved surface (or against pins mounted on the curved surface), the frontside of the wafer is thereby maintained in a precise equidistant relationship with respect to the reference surface.

A relatively small region of the wafer surface is irradiated while the wafer is held in a fixed position. Movement of the curved chuck is then advantageously accomplished by means of a standard X-Y table. For each movement of the table to position another region of the wafer surface in place for exposure, the focus of the lithographic system is adjusted. This is done either by a focus tracking system or by predetermined variations respectively associated with table movement.

BRIEF DESCRIPTION OF THE DRAWINGS

A complete understanding of the present invention and of the above and other features thereof may be gained from a consideration of the following detailed description presented hereinbelow in connection with the accompanying drawings, not drawn to scale, in which.

DETAILED DESCRIPTION

Figure 1:
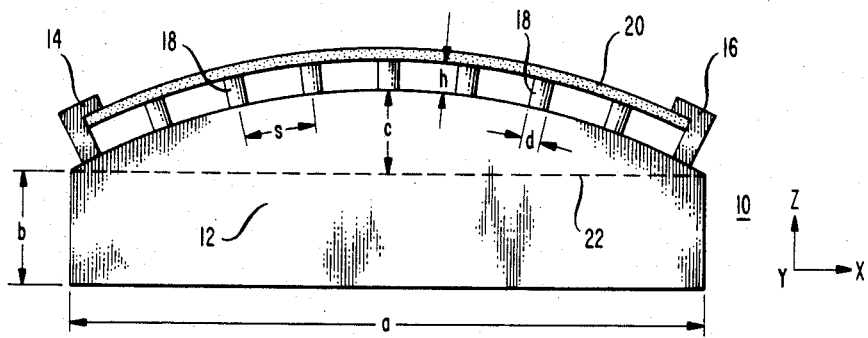
FIG. 1 shows a wafer held in place on a specific illustrative chuck made in accordance with the principles of the present invention.

The specific illustrative workpiece holder shown in FIG. 1 is designed to hold a wafer-shaped workpiece in a vacuum environment. By way of example, the particular workpiece mounted on the depicted holder will be assumed to be a conventional semiconductor wafer of the type utilized to fabricate integrated-circuit devices.

The wafer holder or chuck 10 represented in FIG. 1 includes a base portion 12 and clamps 14 and 16. Advantageously, the chuck 10 also includes a multiplicity of pins 18 on the base portion 12.

Illustratively, the base portion 12 of FIG. 1 is a solid block made of a conductive material such as nonmagnetic stainless steel. In accordance with the principles of the present invention, the top of the portion 12 constitutes a curved surface. (For emphasis only, the curvature of this surface is greatly exaggerated in FIG. 1). Advantageously, the depicted curved surface comprises a portion of the surface of a cylinder.

For purposes of a specific illustrative example, the particular chuck represented in FIG. 1 will be assumed to be designed to hold a wafer 20 approximately 15 centimeters (cm) in diameter. For this particular case, the dimensions a and b of the specific illustrative base portion 12 of the depicted chuck are approximately 17 cm and 1 cm, respectively. Additionally, in this case the base portion 12 extends about 17 cm in the Y direction indicated in FIG. 1. Further, the circular arc of the portion 12 shown in FIG. 1 corresponds to a portion of a circle having a radius of approximately 10 meters.

In FIG. 1, distance c represents the maximum deviation of the top surface of the base portion 12 from a perfectly flat or X-Y planar surface indicated by dash line 22. In the particular illustrative embodiment considered herein, the distance c is about 250 micrometers ($\mu$m).

In accordance with the principles of the present invention, the distance c (FIG. 1) is selected to exceed the maximum deviation-from-flatness or warpage inherently exhibited by wafers of the type to be held by the depicted chuck. For a semiconductor wafer that exhibits a maximum warpage of about 25 $\mu$m, a deviation c of about 250 $\mu$m is adequate in practice to ensure that forces due to bending the wafer will be sufficient to hold the wafer in place on the depicted chuck.

In accordance with applicant's invention, the top surface of the wafer 20 shown in FIG. 1 is intended to be maintained substantially exactly equidistant from the top or reference curved surface of the base portion 12 of the herein-described chuck. But, due to the inevitable presence of dirt particles, this desired equidistant relationship is often dificult to achieve by simply bringing the bottom of the wafer 20 into direct contact with the top surface of the base portion 12.

In practice, dirt particles inevitably lodge between the wafer 20 and the base portion 12 to prevent intimate contact therebetween. Removal of particulates from the air in a clean room environment does not totally solve this problem because dirt particles also come from the wafers themselves. Such wafer-produced particles occur in the form of chips from the wafer edges and flakes from films grown or deposited on the wafer.

The size of dirt particles typically encountered in an integrated-circuit fabrication process may be 10 $\mu m$ in diameter or greater. The effect of such particles interposed between the wafer 20 and the base portion 12 of FIG. 1 can be to cause the front surface of the wafer to deviate sufficiently from the aforespecified desired equidistant relationship to produce pattern distortion during lithographic exposure.

An attractive technique for minimizing the problem caused by dirt particles interposed between a wafer and a chuck is described in U.S. Pat. No. 4,213,698. As described therein, a multiplicity of regularly spaced-apart pins are mounted on a chuck. The top surfaces of the pins are designed to contact the bottom surface of the wafer. Since each pin surface is relatively small, it is highly unlikely that a dirt particle will reside on it. If a particle does so reside, it would normally be brushed off by any slight lateral movement of the wafer during the course of positioning the wafer on the chuck. Further, the small contact areas of the pins would tend to squeeze out any dirt particles that remain after the wafer is moved into place on the chuck.

In view of the aforementioned advantages of including pins in a wafer chuck, the specific illustrative embodiment of applicant's invention depicted in FIG. 1 includes such pins. These pins, designated by reference numeral 18 in FIG. 1, may assume a variety of shapes. By way of example, the particular pins 18 represented in FIG. 1 will be assumed to comprise multiple substantially identical cylindrical columns securely mounted in the base portion 12 in any standard way. Or the pins can be formed as an integral part of the portion 12 in, for example, a conventional machining operation.

Each of the specific illustrative column-shaped pins 18 represented in FIG. 1 includes a top surface designed to contact a portion of the bottom surface of the wafer 20. (In practice, these pin surfaces can be each simply made to be flat. Alternatively, the top surface of each pin can be curved to correspond substantially exactly with the respective curved wafer portion to be contacted.) Advantageously, the main longitudinal axis of each of the pins 18 is perpendicular to the main Y-direction longitudinal axis of the cylindrical segment that constitutes the top part of the base portion 12.

By way of example, each of the substantially identical pins 18 shown in FIG. 1 has a height h of approximately 250-to-500 $\mu m$ and a diameter d of about 1000-to-2000 $\mu m$. The pins are typically uniformly distributed on the curved surface of the base portion 12. Illustratively, the center-to-center spacing s of the pins 18 is about 0.64 cm.

In cases in which the pins 18 of FIG. 1 are separable elements that are mounted in standard ways on the top surface of the base portion 12, the pins can be made of a variety of materials. Thus, for example, the pins can be made of stainless steel. Further, if more wear-resistant pin surfaces are required, the pins 18 or at least the upper portions thereof can be made of a material such as sapphire.

The clamps 14 and 16 of FIG. 1 constitute standard wafer clamps. They are mounted on the top surface of the base portion 12 and serve to retain the bottom surface of a bent wafer in form contact with the top surfaces of the pins 18.

Illustratively, the clamps 14 and 16 of FIG. 1 are made of a suitable conductive material. The wafer 20 can be thereby connected to a point of reference potential even if the pins 18 are nonconductive. In that way, the wafer is established at a specified electrical potential rather than being allowed to float. In practice, this may be important in, for example, electron-beam lithography.

Figure 2:
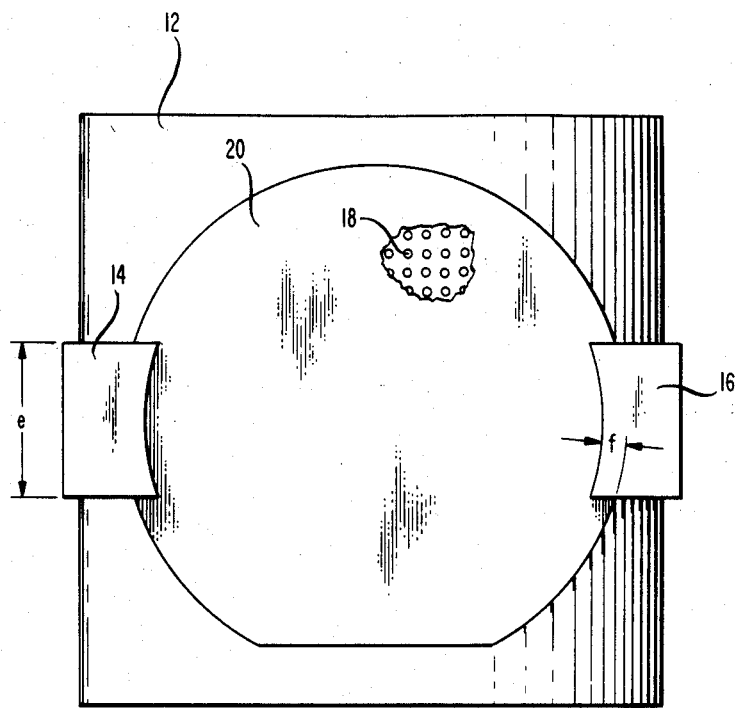
FIG. 2 is a top view of FIG. 1 with a portion of the wafer broken away to show the structure of the underlying chuck.

As indicated in FIG. 2, the particular illustrative clamps 14 and 16 described herein engage substantial peripheral extents of the wafer 20. For a wafer having a diameter of approximately 15 cm, each of the depicted clamps has a dimension e of, for example, about 5 cm. The extent f over which the clamps engage opposite portions of the surface of the wafer 20 is approximately 0.32 cm.

In some cases, it is advantageous to design the clamps 14 and 16 to be retractable. Thus, for example, the clamp 14 shown in FIG. 2 can be designed to be retractable to the left and the clamp 16 can be designed to be retractable to the right. Such retractable clamps, which are well known in the art, can facilitate the placement and/or removal of the wafer 20 on the depicted chuck. In turn, such placement and removal can be done manually or in a straightforward way by conventional wafer handling equipment.

A part of the wafer 20 shown in FIG. 2 is broken away to reveal the top surfaces of some of the underlying pins 18. In an embodiment of the illustrative type depicted in FIGS. 1 and 2, a total of approximately 400 pins of the type described earlier above underlie the 15-cm-diameter wafer 20.

Figure 3:
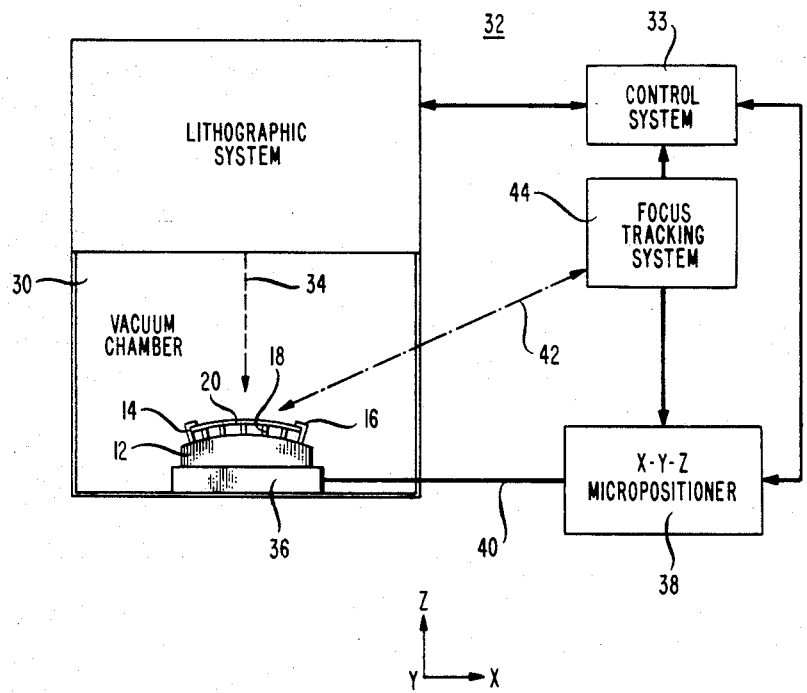
FIG. 3 is a schematic representation of the FIG. 1 arrangement mounted in the vacuum chamber of a lithographic system.

FIG. 3 schematically depicts a wafer chuck assembly of the type shown in FIGS. 1 and 2 mounted in the vacuum chamber 30 of lithographic system 32. By way of example, the system 32 is assumed to be a conventional electron-beam or ion-beam system including a standard beam column (not shown) and control system 33. In FIG. 3, dashed line 34 represents a charged-particle beam of electrons or ions. At the surface of the wafer 20, this beam has a diameter of, for example, approximately 0.25 $\mu m$.

In FIG. 3, the base portion 12 of the herein-described chuck is mounted on a conventional X-Y-Z movable table 36. In turn, the movement of the table 36 is controlled by a standard X-Y-Z micropositioner 38 that is mechanically coupled by linkage 40 to the table 36.

In practice, the top surface of the wafer 20 shown in FIG. 3 typically includes thereon a layer of an electron-beam-sensitive or ion-beam-sensitive resist. Selective irradiation of such a layer constitutes the initial step of a standard lithographic process utilized to fabricate integrated-circuit devices.

In standard ways known in the art, the beam 34 directed at the curved surface of the wafer 20 of FIG. 3 is established to be in focus at a reference point on the surface of the wafer. Once established, this focused condition is maintained along an elongated Y-direction element that extends across the entire diameter of the wafer surface. Some combination of Y-direction mechanical movement of the table 36 and Y-direction scanning of the beam 34 may be advantageous for carrying out the irradiation of that extended Y-direction surface element.

Of course, even an extremely narrow Y-direction element of the curved wafer surface of FIG. 3 is actually slightly non-planar with respect to the indicated X-Y plane. But in practice such slight deviations from planarity over limited X-direction extents of the wafer surface are tolerable even for high-resolution lithographic patterning. In fact, in some cases irradiation of a Y-direction element of the wafer surface may also include some limited X-direction beam scanning while at the same time carrying out Y-direction scanning and/or mechanical movement of the table 36.

After irradiation of an entire Y-direction element of the wafer surface depicted in FIG. 3 has been completed, the table 36 is moved to reposition the wafer under the beam 34. Illustratively, the table 36 is moved in the X direction by an amount sufficient to locate the next Y-direction element to be selectively irradiated in butting relationship with the previously irradiated Y-direction element. Before commencing irradiation of the next Y-direction element, however, the beam is refocused to compensate for the fact that the center of the next Y-direction element to be irradiated is at a different Z-direction elevation than the center of the previously irradiated Y-direction element.

The aforespecified refocusing of the beam 34 can be carried out in a variety of ways. For example, since the successive changes in Z-direction elevation that will occur as the table 36 is stepped in the X-direction are known in advance, successive previously programmed changes in focus can be periodically made in respective synchronization with X-direction stepping of the table. Since the curvature of the wafer corresponds substantially exactly with the known curvature of the top surface of the base portion 12 of the herein-specified chuck, such programmed changes in the focus of the beam 34 can be exactly calculated in advance and embodied in the control system 33 of the depicted lithographic equipment.

Alternatively, the aforespecified refocusing of the beam 34 of FIG. 3 can be carried out under control of a standard focus tracking system 44. For each X-direction position of the table 36, the system 44 directs a light beam 42 at a glancing angle at a portion of the wafer surface element to be next irradiated by the beam 34. Light reflected from the wafer surface back to the system 44 provides a basis for determining the Z-direction elevation of the wafer surface, in a manner well known in the art.

Thus, focus tracking of the beam 34 (FIG. 3) may be carried out in a pre-programmed way or under control of the system 44. In either case, the actual focus adjustment can be made either by moving the table 36 in the Z direction or by applying electrical control signals from the system 33 to standard focusing elements included in the beam column of the lithographic system, in a manner well known in the art.

Finally, it is to be understood that the abovedescribed structures and techniques are only illustrative of the principles of the present invention. In accordance with these principles, numerous modifications and alternatives may be devised by those skilled in the art without departing from the spirit and scope of the invention. For example, although emphasis above was put on periodic X-direction stepping of the table 36 to move the surface of the wafer 20 into successive positions for Y-direction irradiation of the surface, other ways of moving the wafer are feasible. Thus, the wafer surface may be rotated in a step-wise fashion along the curved arc defined by that surface. In that alternative case, each Y-direction wafer element to be irradiated is successively positioned at the same distance from the beam source. One advantage of this alternative approach is that successive focus adjustments are not needed. A single initial focus setting suffices for exposure of the entire curved surface of the wafer 20.

Also, a chuck made in accordance with this invention may be designed to have a curved surface other than the particular illustrative cylindrical surface specified above. Thus, for example, the surface of the chuck may constitute a portion of the surface of a sphere. Further, the curved surface of the chuck may be concave rather than convex. For a concave chuck surface, a wafer would be pulled down and held by clamps positioned on opposite sides of the wafer at or near the bottom of the concave surface.

What is claimed is:

1. A method of making integrated-circuit devices by selectively irradiating the surface of a semiconductor wafer that is contained in the vacuum chamber of a lithographic system, both the wafer surface to be irradiated and the opposite surface of said wafer being exposed to the same pressure within said chamber, said method comprising the steps of
    mounting said wafer in said chamber on a chuck having a curved reference surface to establish the top surface of the wafer substantially equidistant from the curved reference surface of said chuck,
    and selectively irradiating the top surface of said mounted wafer to define device features therein,
    wherein the top surface of said mounted wafer is irradiated with a charged-particle beam emanating from a source in said system,
    wherein irradiation of the top surface of said mounted wafer is carried out by stepping the curved wafer under said beam,
    wherein the beam is focused with respect to the wafer surface at each step,
    and wherein said chuck includes multiple substantially equal-height pins and said wafer is mounted to ensure that respective portions of its bottom surface are in contact with the top surfaces of said pins.

2. A method as in claim 1 wherein said curved reference surface comprises a segment of the surface of a cylinder.

3. A method as in claim 2 wherein focusing of the beam at each step is carried out in a preprogrammed way.

4. A method as in claim 3 wherein focusing is accomplished by applying control signals to a beam-forming column included in said system.

5. A method as in claim 3 wherein focusing is accomplished by varying the distance between the beam source and the surface of said wafer.

6. A method as in claim 2 wherein focusing of the beam at each step is determined by a focus tracking system.

7. A method as in claim 6 wherein focusing is accomplished by applying control signals from the focus tracking system to a beam-forming column included in said system.

8. A method as in claim 6 wherein focusing is accomplished by varying the distance between the beam source and the surface of said wafer under control of signals supplied by said focus tracking system.

* * * * *